United States Patent [19]

Morishima

[11] Patent Number: 6,005,427

[45] Date of Patent: *Dec. 21, 1999

[54] DIGITAL PLL CIRCUIT

[75] Inventor: Morito Morishima, Hamamatsu, Japan

[73] Assignee: Yamaha Corporation, Shizuoka-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/740,138

[22] Filed: Oct. 22, 1996

[30] Foreign Application Priority Data

Dec. 6, 1995 [JP] Japan .................................. 7-318241

[51] Int. Cl.[6] .......................... H03K 19/00; H03L 7/099
[52] U.S. Cl. .................................... 327/159; 327/150
[58] Field of Search .................................. 327/147–153, 327/156–161, 244, 248; 375/375, 376

[56] References Cited

U.S. PATENT DOCUMENTS

| | | | |
|---|---|---|---|
| 4,506,175 | 3/1985 | Reitmeier et al. | 327/12 |
| 4,577,163 | 3/1986 | Culp | 331/1 A |
| 4,930,142 | 5/1990 | Whiting et al. | 375/120 |
| 5,206,889 | 4/1993 | Unkrich | 327/160 |
| 5,291,144 | 3/1994 | Ichiyoshi | 327/156 |
| 5,311,511 | 5/1994 | Reilly et al. | 370/84 |
| 5,442,315 | 8/1995 | Hutchins | 327/159 |
| 5,563,535 | 10/1996 | Corry et al. | 327/159 |
| 5,638,010 | 6/1997 | Adams | 327/105 |

FOREIGN PATENT DOCUMENTS

| | | |
|---|---|---|
| 277726 | 8/1988 | European Pat. Off. . |
| 492588 | 7/1992 | European Pat. Off. . |
| 4-688175791 | 3/1992 | Japan . |

OTHER PUBLICATIONS

Hikawa, H. and Mori, S., "A Digital Frequency Synthesizer with a Phase Accumulator," 1988 IEEE International Symposium on Circuits and Systems (Jun. 7–9, 1988).

*Primary Examiner*—Tuan T. Lam
*Attorney, Agent, or Firm*—Hazel & Thomas, P.C.

[57] ABSTRACT

In a digital PLL circuit, a DCO 3a comprising a full adder 33 and a delay circuit 34 accumulate a frequency control data N, to generate digital phase data ACC which periodically changes at a rate corresponding to the frequency control data N, a latch circuit 11 latches the digital phase data ACC with the aid of an input digital signal $\phi_{in}$, and outputs it as a digital phase difference signal PC, and a loop filter 2 removes components in an unwanted frequency band from the digital phase difference signal PC, to form the frequency control data which is applied to the digital control oscillator means. In the digital PLL circuit, the digital phase data ACC itself, being synchronized in phase with the input digital signal $\phi_{in}$, is periodically changed.

6 Claims, 4 Drawing Sheets

DIGITAL PLL CIRCUIT

BACKGROUND OF THE INVENTION

1. Field of the Invention

The present invention relates to a digital PLL circuit which generates a digital signal which is synchronous in phase with an input digital signal.

2. Description of the Related Art

FIG. 7 is a block diagram showing the arrangement of a conventional digital PLL circuit. The conventional digital PLL circuit includes a DPC (Digital Phase Comparator) 1, a loop filter 2, and a DCO (Digital Control Oscillator) 3 including a counter, which are connected to one another in the form of a closed loop.

In the conventional digital PLL circuit, the DPC 1 operates as follows: Whenever an input digital signal $\phi_{in}$ is supplied to the DPC 1, the latter 1 fetches the count value CNT (described later) of the counter in the DCO 3, and holds it, and outputs it as a multi-path phase difference signal PC. The loop filter 2 is made up of a digital low-pass filter for instance. That is, the loop filter 2 removes unwanted frequency components from the phase difference signals which are outputted by the DPC 1 one after another in the above-described manner, and outputs frequency control data N in multiple paths. In the DCO 3, the following operation is repeatedly carried out: That is, a master clock signal of a predetermined frequency f is counted, and whenever the count value CNT reaches the frequency control data N, the counter is reset. Hence, the count value CNT is cyclically increased and decreased at a frequency corresponding to the frequency control data N. FIG. 8 shows variations of the count value CNT. More specifically, FIG. 8A is for the case where a frequency control data N small in value is given; and FIG. 8B is for the case where a frequency control data $N_2$ large in value is given. In any one of those cases, the count value CNT cyclically increases at a predetermined rate corresponding to the frequency f of the master clock signal, and the cycle period is proportional to the frequency control data N. The DCO 3 outputs a digital signal $\phi_o$ according to the count value CNT which is increased and decreased in the above-described manner.

The DPC 1 latches the output count value CNT of the DCO 3 which is outputted in multiple paths, with the aid of the input digital signal $\phi_{in}$, and outputs it as the phase difference signal PC. In the case where the digital signal $\phi_o$ is liable to lag in phase, the count value CNT latched by the DPC 1 with the aid of the input digital signal $\phi_{in}$ (i.e., the output phase difference signal PC of the DPC 1) is decreased. As a result, the frequency control data N is decreased, and the digital signal $\phi_o$ is caused to lead in phase. On the other hand, in the case where the digital signal $\phi_o$ is liable to lead in phase, the count value CNT latched by the DPC 1 with the aid of the input digital signal $\phi_{in}$ is increased. As a result, the frequency control data N is increased, and the digital signal $\phi_o$ is caused to lag in phase. That is, feedback control is carried out. Hence, the counter in the DCO 3 performs the counting operation being synchronous in phase with the input digital signal $\phi_{in}$, and according to the count value of the counter the digital signal $\phi_o$ synchronous in phase with the input digital signal $\phi_{in}$ is produced. The digital PLL circuit of this type has been disclosed, for instance, by Unexamined Japanese Patent Application (OPI) No. Hei. 4-68817.

The above-described digital PLL circuit suffers from a problem that it is difficult to increase its operating range. The problem is as described below:

First, in order to increase the frequency resolution of the digital PLL circuit, it is necessary to increase the frequency f of the master clock signal which is supplied to the counter in the DCO 3.

In order to increase the range of allowable frequencies of the input digital signal $\phi_{in}$ without sacrificing the frequency resolution, it is necessary to increase the frequency f of the master clock signal (hereinafter referred to as "a clock frequency f", when applicable) supplied to the counter in the to a maximum, and to increase the number of bits of the counter, thereby increasing the upper limit value of the count value; i.e., the upper limit value of the frequency control data N.

However, the range of clock frequencies with which the counter operates normally has the upper limit (hereinafter referred to as "a highest operating frequency", when applicable). Hence, it is not permitted to set the clock frequency f to higher than the highest operating frequency.

In general, if, in the counter, the number of bits is increased, then the highest operating frequency is lowered. Hence, the request for increasing the clock frequency f is not compatible with the request for increasing the number of bits of the counter.

If, in this case, the number of bits of the counter is increased with the clock frequency f decreased, then it is possible to increase the range of allowable frequencies of the input digital signal $\phi_{in}$ with which the digital PLL circuit may be synchronous in phase; however, the frequency resolution of the digital PLL circuit is lowered.

If, on the other hand, the number of bits of the counter is decreased with the clock frequency f increased, then the frequency resolution of the digital PLL circuit may be sufficiently high; however, it is impossible to decrease the lower limit value of the range of allowable frequencies of the input digital signal $\phi_{in}$.

As is apparent from the above description, in order to increase the range of allowable frequencies of the input digital signal, the frequency resolution of the digital PLL circuit must be sacrificed therefor; and in order to obtain a satisfactory frequency resolution, the range of frequencies of the input digital signal must be sacrificed therefor. Hence, it is difficult to increase the operating range of the digital PLL circuit.

The conventional digital PLL circuit suffers from another problem in that the phase-to-digital conversion gain of the DPC 1 varies depending on the frequency control data N, whereby the PLL loop gain is changed. As a result, it is difficult to obtain a stable operation over a wide range of frequencies. The problem will be described in more detail.

First, as shown in FIG. 8A, when a frequency control data $N_1$ is given, the count value CNT of the counter in the DCO 3 is cyclically increased and decreased with a frequency $f_1$. In response to the input digital signal $\phi_{in}$, the count value CNT (=M) at that time instant is latched by the DPC 1, and is outputted as the phase difference signal PC.

In this operation, M master clock signals (where M is the number of the master clock signals) of the frequency f are counted until the digital signal $\phi_{in}$ is inputted, and therefore the period of time is M/f which elapses from the time instant that the count value CNT starts to increase until the digital signal $\phi_{in}$ is inputted. On the other hand, the period of increase and decrease of the count value CNT is $1/f_1$, which corresponds to a phase angle of $2\pi$. Hence, the true phase difference between the digital signal $\phi_{in}$ and the count value CNT is as follows:

$$2\pi\{(M/f)/(1/f_1)\}=2\pi Mf_1/f$$

Next, as shown in FIG. 8B, when a frequency control data $N_2$ ($N_2 > N_1$) is given, the count value CNT of the counter in the DCO 3 is cyclically increased and decreased with a frequency $f_2$ ($f_2 < f_1$). In response to the input digital signal $\phi_{in}$, similarly as in the above-described case, the count value M is latched by the DPC 1, and outputted as the phase difference signal PC.

In this case, similarly as in the above-described case, the period of time which elapses from the time instant that the count value CNT starts to increase until the digital signal $\phi_{in}$ is inputted is M/f. However, the period of increase and decrease of the count value CNT is $1/f_2$, which corresponds to a phase angle of $2\pi$. Hence, the phase difference between the digital signal $\phi_{in}$ and the count value CNT is $2\pi(Mf_2)/f$, which is smaller than the above-described value $2\pi Mf_1/f$.

As is apparent from the above-description, the phase difference between the digital signal $\phi_{in}$ and the count value CNT is not determined by the count value CNT only which is latched by the DPC 1; and even if the count values CNT latched are the same, those count values CNT represent different phase differences depending on the frequency control data N. That is, in converting the phase difference into the digital signal, the gain depends on the frequency control data N.

If the phase-to-digital conversion gain changes in the above-described manner, then the PLL loop gain is varied, which gives rise to the above-described problem.

SUMMARY OF THE INVENTION

In view of the foregoing, an object of the invention is to provide a digital PLL circuit which is stable in phase synchronization over a wide frequency range without sacrificing the frequency resolution.

The foregoing object of the invention has been achieved by the provision of a digital PLL circuit which, according to the invention, comprises:

digital control oscillator means for generating digital phase data which periodically changes at a rate corresponding to frequency control data;

phase comparison means for holding, whenever an input digital signal is applied thereto, the digital phase data at that time instant, and outputs the digital phase data as a digital phase difference signal; and a loop filter which removes components in an unwanted frequency band from the digital phase difference signal, to form the frequency control data which is applied to the digital control oscillator means, a digital signal synchronous in phase with the input digital signal being outputted according to the digital phase data.

DESCRIPTION OF THE PREFERRED EMBODIMENTS

As conducive to a full understanding of the invention, its preferred embodiments will be described; however, it should be noted that the invention is not limited thereto or thereby.

Figure 1:
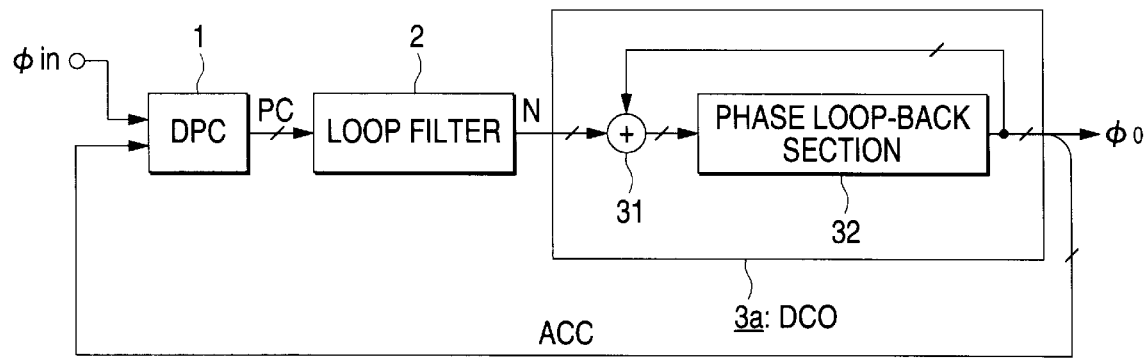
FIG. 1 is a diagram showing the fundamental arrangement of an example of a digital PLL circuit, which constitutes a first embodiment of the invention.
Figure 7:
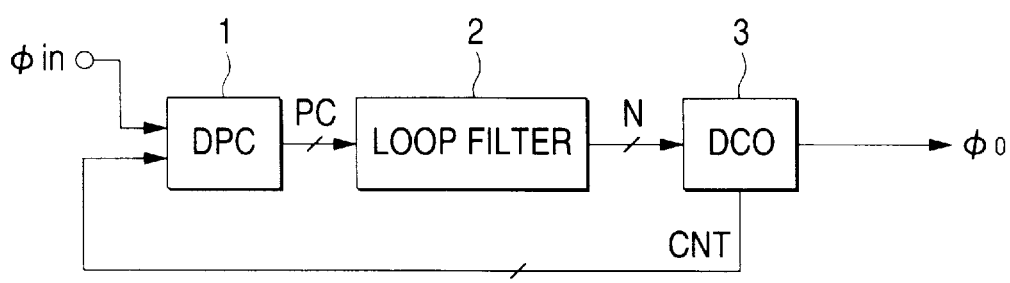
FIG. 7 is a diagram showing the arrangement of a conventional digital PLL circuit.
Figure 8A:
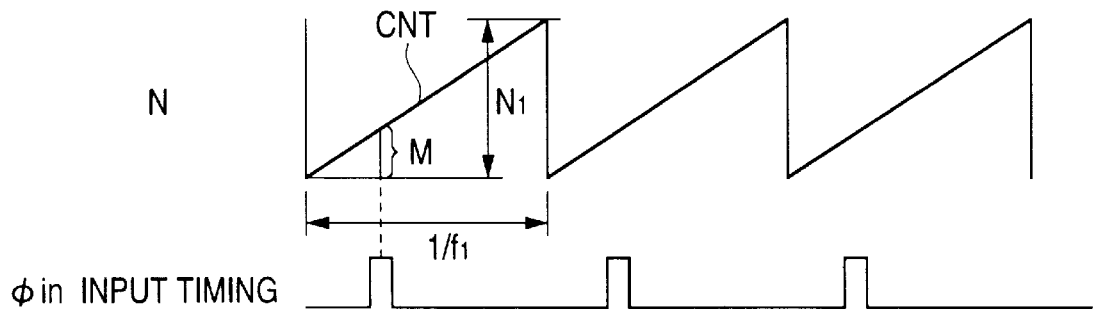
FIGS. 8A 8B are diagrams for a description of the operation of the conventional digital PLL circuit shown in FIG. 7.
Figure 8B:
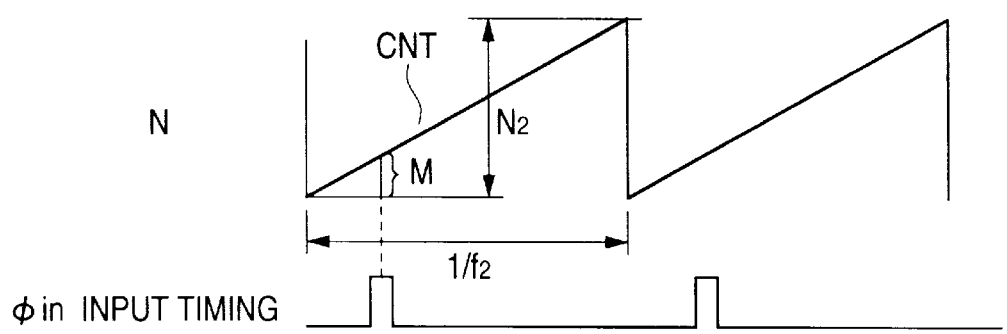

FIG. 1 is a block diagram showing the fundamental arrangement of an example of a digital PLL circuit, which constitutes a first embodiment of the invention. In the digital PLL circuit, its DCO 3a is completely different from the above-described DCO 3 shown in FIG. 7.

The DCO 3a comprises an adder 31 and a phase loop-back section 32 which are arranged in the form of a loop. Similarly as in the above-described conventional digital PLL circuit, the digital PLL circuit comprises a loop filter 2 between a DPC 1 and the DCO 3a, and the loop filter 2 supplies a multi-path frequency control data N to the DCO 3a. In the DCO 3a, whenever a master clock signal (of a frequency of f) is applied thereto, the frequency control data N is accumulated by the adder 31, and the value of accumulation is outputted in multiple paths, as a digital phase data ACC, by the phase loop-back section 32. The phase loop-back section 32 is to periodically change the digital phase data ACC in a range of from 0 to $2\pi$. Hence, the phase loop-back section 32 operates as follows: That is, when the digital phase data ACC obtained in multiple paths from the adder 31 exceeds $2\pi$, the phase loop-back section 32 operates to subtract $2\pi$ from the digital phase data ACC, and return the resultant ACC to the adder 31.

Figure 2:
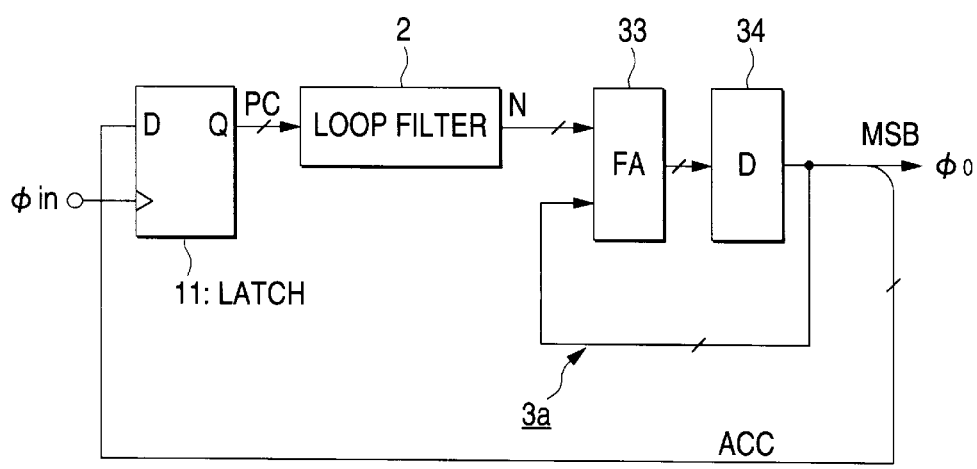
FIG. 2 is a diagram showing a concrete circuit of the digital PLL circuit shown in FIG. 1.

FIG. 2 shows a concrete example of the digital PLL circuit. In the digital PLL circuit shown in FIG. 2, the DPC 1 is made up of a latch circuit 11, and the DCO 3a is made up of a full adder 33 and a delay circuit 34 which are arranged in the form of a loop. The loop filter 2 outputs the frequency control data N in multiple paths, which is applied to one input terminal of the full adder 33. The master clock signal of the frequency of f is applied to the delay circuit. The output data of the full adder 33 in multiple paths is delayed as much as 1/f by the delay circuit 34 and returned in multiple paths to the other input terminal of the full adder 33.

Figure 3A:
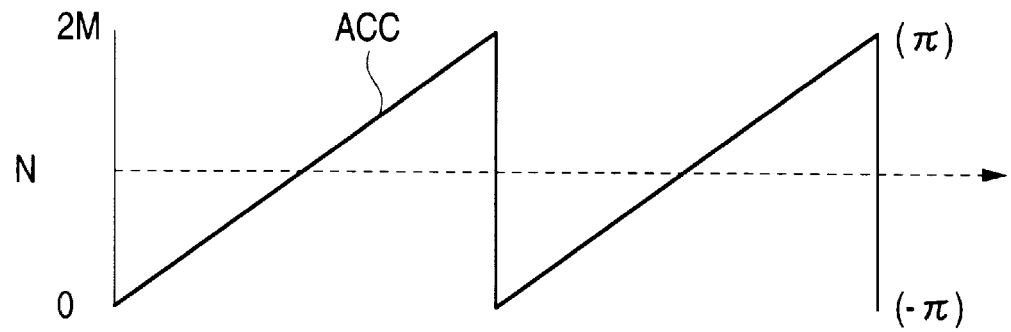
FIGS. 3A 3B are diagrams for a description of the operation of the digital PLL circuit shown in FIG. 2.
Figure 3B:
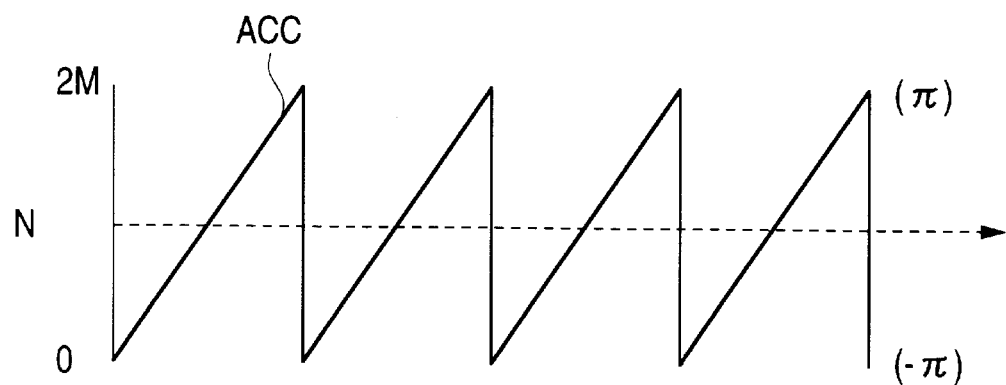

In the digital PLL circuit thus organized, the full adder 33 and the delay circuit 34 function as an accumulator. That is, whenever the master clock signal is applied to the delay circuit, the frequency control data is accumulated. The value of accumulation; i.e., the digital phase data ACC is outputted in multiple paths by the delay circuit. The FIGS. 3A, 3B show examples of the waveform of the digital phase data ACC thus obtained. FIG. 3A is for the case where the frequency control data N is small in value, and FIG. 3B is for the case where the frequency control data N is large in value. As is seen from those graphical representations, the digital phase data ACC increases at a rate corresponding to the given frequency control data N. If the maximum value which can be represented by the number of bits of the digital phase data is 2M, then the digital phase data ACC periodically changes in a range of from 0 to 2M.

The digital phase data ACC thus obtained represents a phase itself; ACC=0 corresponds to a phase of $-\pi$, and ACC=2M corresponds to a phase of $\pi$. In the embodiment, control is so made as to synchronize the phase represented directly by the digital phase data ACC with the phase of the input digital signal $\phi_{in}$.

That is, the multi-path digital phase data ACC is latched by the latch circuit 11 with the aid of the input digital signal $\phi_{in}$, and outputted as the multi-path phase difference signal PC. In the case where the digital phase data ACC is liable to lag in phase, the value of the digital phase data ACC latched by the latch circuit 11 (that is, the phase difference signal PC outputted by the DPC 1) is decreased. In this case, the multi-path frequency control data N outputted by the loop filter 2 is increased, so that the digital phase signal ACC is caused to lead in phase. In the above-described embodiment, as was described above, in the case where the phase difference signal PC decreases, it is necessary to increase the frequency control data. Hence, the above-described embodiment should be so modified that, for instance, a circuit for converting the phase difference signal PC into a complement is provided in the loop filter 2.

On the other hand, in the case where the digital phase data ACC is liable to lag in phase, the value of the digital phase data ACC latched by the latch circuit 11 is decreased. In this case, the frequency control data N outputted by the loop filter 2 is decreased, and the digital phase data ACC is caused to lag in phase.

That is, in the digital PLL circuit, feedback control is carried out in the above-described manner, so that the digital phase data ACC periodically changes in synchronization with the input digital signal $\phi_{in}$. And the MSB (Most Significant Bit) of the multi-path digital phase data ACC is outputted as an output digital signal $\phi_o$. Thus, the digital signal $\phi_o$ is obtained which is synchronous in phase with the input digital signal $\phi_{in}$.

In the above-described embodiment, the multi-path digital phase data ACC latched with the aid of the input digital signal $\phi_{in}$ directly represents the phase itself. Hence, independently of the value of the frequency control data N, the phase-to-digital conversion gain is maintained constant at all times. Accordingly, the operation of the digital PLL circuit is stable over a wide frequency range, and the loop filter can be readily designed.

In the prior art, the master clock signal is subjected to frequency division to obtain the output digital signal $\phi_o$. On the other hand, in the invention, the periodic change of the digital phase data ACC is synchronized in phase with the input digital signal $\phi_{in}$, and therefore, in order to obtain a sufficiently high frequency resolution, it is unnecessary to make the frequency of the master clock signal so high. Hence, with the digital PLL circuit, the digital phase data ACC can be synchronized in phase with the input digital signal $\phi_{in}$ without sacrificing of the frequency resolution.

In the embodiment, the output digital signal $\phi_o$ is of a square waveform with a duty ratio of 50%; however, the invention is not limited thereto or thereby. That is, it may be of a waveform other than the square waveform. For instance, the digital PLL circuit may be so modified that a waveform ROM is provided in which sinusoidal sample data are stored, and a sample data corresponding to the digital phase data ACC is read from the waveform ROM. In this case, since the digital phase data represents the phase angle itself, a sinusoidal waveform which is synchronized in phase with the input digital signal $\phi_{in}$ and is not distorted, is obtained from the waveform ROM.

Figure 4:
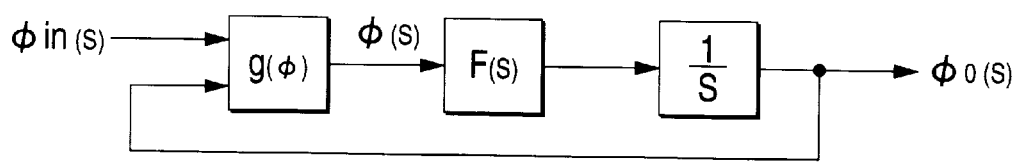
FIG. 4 is a diagram for a description of the signal transmission in an ordinary analog PLL circuit.
Figure 5:
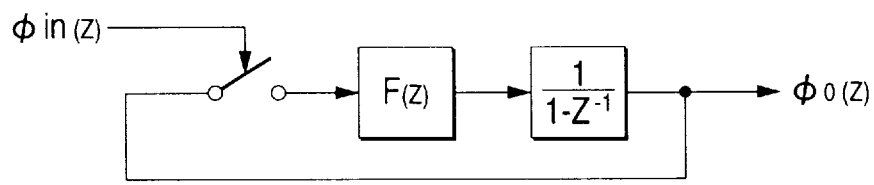
FIG. 5 is a diagram for a description of the signal transmission in the digital PLL circuit shown in FIG. 2.

The above-described embodiment is advantageous in that designing data of a conventional analog PLL circuit can be utilized as they are. FIG. 4 is a diagram for a description of the signal transmission in a conventional ordinary analog PLL circuit, and FIG. 5 is a diagram for a description of the signal transmission in the digital PLL circuit shown in FIG. 2. As is apparent from those figures, the signal processing operation of the digital PLL circuit of the invention is equivalent to that of the analog PLL circuit. Hence, the designing data obtained in the development of the analog PLL circuit can be utilized; for instance, a loop filter which is obtained by digitalizing the loop filter in the analog PLL circuit as it is, may be employed.

Figure 6:
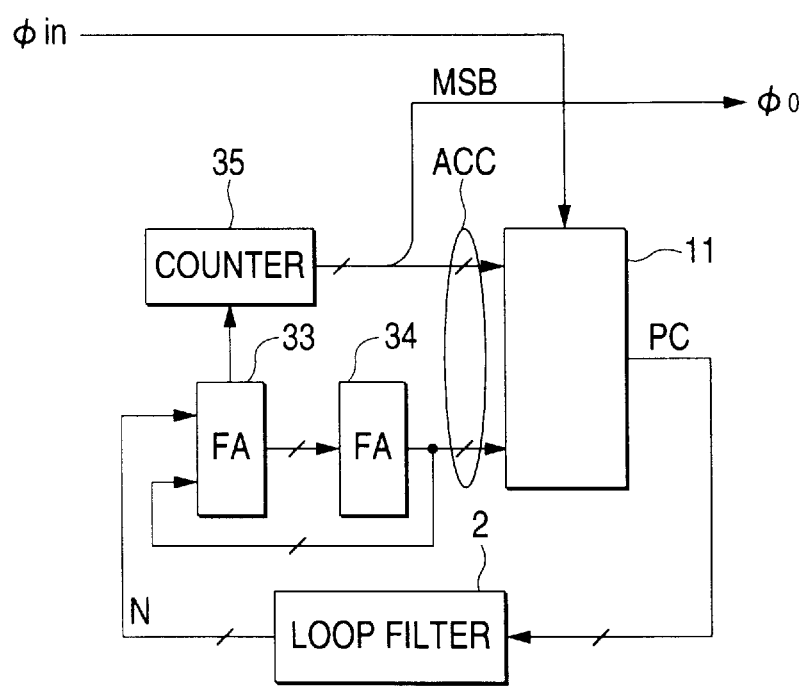
FIG. 6 is a diagram showing the arrangement of another example of the digital PLL circuit, which constitutes a second embodiment of the invention.

In order to further improve the frequency resolution, the circuit shown in FIG. 2 is modified as shown in FIG. 6. That is, digital phase data generating means is made up of the full adder 33, the delay circuit 34, and a counter 35. The latch circuit 11 holds the digital phase data ACC consisting of the output data (decimal part) of the delay circuit 34 and the output data (integer part) of the counter 35 whenever the input digital signal $\phi_{in}$ is applied thereto, and outputs it as the multi-path phase difference data PC. The loop filter 2 selectively filters only the decimal part of the digital phase difference data, and outputs the multi-path frequency control data N which is zero (0) or larger but smaller than one (1). In the accumulator comprising the full adder 33 and the delay circuit 34, the frequency control data is accumulated; and in the counter 35, the count value is increased in response to a carry done by the full adder 33. And the MSB of the digital data representing the count value of the counter 35 is outputted as the output digital signal $\phi_o$ which is synchronous in phase with the input digital signal $\phi_{in}$. The frequency of the master clock signal is set to the highest operating frequency of the counter 35. The operations of the full adder 33 and the delay circuit 34 cause no troubles even if delayed somewhat, and therefore they may be of a pipe line arrangement. That is, the operating frequency can be increased. With this arrangement, the digital phase data ACC consists of the integer part and the decimal part, and the number of digits can be increased as a whole, which improves the frequency resolution.

As was described above, the digital PLL circuit of the invention comprises: the digital control oscillator means for generating the digital phase data which periodically changes at a rate corresponding to the frequency control data; the phase comparison means for holding, whenever the input digital signal is applied thereto, the digital phase data at that time instant, and outputs it as the digital phase difference signal; and the loop filter which removes components in an unwanted frequency band from the digital phase difference signal, to form the frequency control data which is applied to the digital control oscillator means, the digital signal synchronously in phase with the input digital signal being outputted according to the digital phase data. Hence, in the digital PLL circuit of the invention, the phase synchronization can be obtained stably over a wide frequency range. This effect should be highly appreciated.

What is claimed is:

1. A digital PLL circuit comprising:
   digital control oscillator device (DCO) for generating digital phase data (ACC), and for periodically changing said digital phase data (ACC) in a range of from 0 to $2\pi$ at a rate corresponding to frequency control data (N), said digital control oscillator device (DCO) including phase loop-back means for subtracting $2\pi$ from said digital phase data (ACC) when digital phase data generated within said digital control oscillator device (DCO) exceeds $2\pi$;
   a phase comparison device for latching said digital phase data (ACC) at time instances in accordance with a digital input signal being applied thereto, and for outputting a digital phase difference signal (PC) based on said digital phase data (ACC) and said digital input signal; and a loop filter for removing components in an unwanted frequency band from said digital phase difference signal (PC), and operatively connected to generate said frequency control data (N) which is inputted into said digital control oscillator device (DCO), wherein said phase loop-back means of said digital control oscillator device (DCO) is further for outputting a digital output signal synchronously in phase with said input signal and derived from said digital phase data (ACC), and said digital control oscillator device (DCO), said phase comparison device and said loop filter are connected to each other via multi-path signal lines so as to output said digital phase difference signal, said frequency control data and said digital phase data, respectively, as multi-bit data signals along said multi-path signal lines.

2. The digital PLL circuit according to claim 1, wherein said digital control oscillator device further comprises an adder operatively connected to said phase loop-back means in the form of a loop.

3. The digital PLL circuit according to claim 2, wherein said adder is operatively connected to generate first digital phase data that is inputted into said phase loop-back means which outputs said digital phase data (ACC), and said phase-loop back means is operatively connected to return said digital phase data (ACC) to said adder, whereby when said first digital phase data exceeds $2\pi$, said phase loop-back means subtracts $2\pi$ from said digital phase data (ACC).

4. A digital PLL circuit, comprising:

digital control oscillator device (DCO) for generating digital phase data (ACC), and for periodically changing said digital phase data (ACC) in a range of from 0 to $2\pi$ at a rate corresponding to frequency control data (N), said digital control oscillator device (DCO) including a full adder with a delay circuit operatively connected in the form of a loop for subtracting $2\pi$ from said digital phase data (ACC) when digital phase data generated within said digital control oscillator device (DCO) exceeds $2\pi$;

a phase comparison device for latching said digital phase data (ACC) at time instances in accordance with a digital input signal being applied thereto, and for outputting a digital phase difference signal (PC) based on said digital phase data (ACC) and said digital input signal, said phase comparison device including a latch circuit; and a loop filter for removing components in an unwanted frequency band from said digital phase difference signal (PC), and operatively connected to generate said frequency control data (N) which is inputted into said digital control oscillator device (DCO), wherein said delay circuit of said digital control oscillator device (DCO) is further for outputting a digital output signal synchronously in phase with said input signal and derived from said digital phase data (ACC), and said digital control oscillator device (DCO), said phase comparison device and said loop filter are connected to each other via multi-path signal lines so as to output said digital phase difference signal, said frequency control data and said digital phase data, respectively, as multi-bit data signals along said multi-path signal lines.

5. A digital PLL circuit, comprising:

digital control oscillator device (DCO) for generating digital phase data (ACC), and for periodically changing said digital phase data (ACC) in a range of from 0 to $2\pi$ at a rate corresponding to frequency control data (N), said digital control oscillator device (DCO) including a full adder, a counter and a delay circuit operatively connected for subtracting $2\pi$ from said digital phase data (ACC) when digital phase data generated within said digital control oscillator device (DCO) exceeds $2\pi$;

a phase comparison device for latching said digital phase data (ACC) at time instances in accordance with a digital input signal being applied thereto, and for outputting a digital phase difference signal (PC) based on said digital phase data (ACC) and said digital input signal, said phase comparison device including a latch circuit; and a loop filter for removing components in an unwanted frequency band from said digital phase difference signal (PC), and operatively connected to generate said frequency control data (N) which is inputted into said digital control oscillator device (DCO), wherein said counter of said digital control oscillator device (DCO) is further for outputting a digital output signal synchronously in phase with said input signal and derived from said digital phase data (ACC), and said digital control oscillator device (DCO), said phase comparison device and said loop filter are connected to each other via multi-path signal lines so as to output said digital phase difference signal, said frequency control data and said digital phase data, respectively, as multi-bit data signals along said multi-path signal lines.

6. The digital PLL circuit according to claim 1, wherein the digital output signal is a digital signal ($\phi_o$) of a square waveform with a duty ratio of 50%.

* * * * *